United States Patent [19]

Eberlein

[11] Patent Number: 5,086,334
[45] Date of Patent: Feb. 4, 1992

[54] CHIP CARRIER

[75] Inventor: Delvin D. Eberlein, Altoona, Wis.

[73] Assignee: Cray Research Inc., Eagan, Minn.

[21] Appl. No.: 692,814

[22] Filed: Apr. 25, 1991

Related U.S. Application Data

[63] Continuation of Ser. No. 447,651, Dec. 8, 1989, abandoned.

[51] Int. Cl.$^5$ .............................................. H01L 23/48
[52] U.S. Cl. ......................................... 357/70; 357/55; 357/72; 357/66; 357/73
[58] Field of Search ..................... 357/70, 66, 73, 55, 357/72

[56] References Cited

U.S. PATENT DOCUMENTS

| | | |
|---|---|---|
| 3,484,534 | 12/1969 | Kilby et al. . |
| 3,566,212 | 2/1971 | Marx . |
| 3,617,819 | 11/1971 | Boisvert et al. . |
| 3,668,299 | 6/1972 | McNeal . |
| 3,760,090 | 9/1973 | Fowler . |
| 4,026,412 | 5/1977 | Henson . |
| 4,038,488 | 6/1977 | Lin . |
| 4,142,203 | 2/1979 | Dietz . |
| 4,362,902 | 12/1982 | Grabbe . |
| 4,374,457 | 2/1983 | Wlech, Jr. . |
| 4,556,896 | 12/1985 | Meddles ............................ 357/72 |
| 4,594,770 | 6/1986 | Butt . |
| 4,701,424 | 10/1987 | Mikkor . |
| 4,720,770 | 1/1988 | Jameson . |
| 4,931,854 | 6/1990 | Yonemasu et al. . |

FOREIGN PATENT DOCUMENTS 55-56650 4/1980 Japan ..................................... 357/70

OTHER PUBLICATIONS

"EP & P News in Electronics Manufacturing", by Robert Keeler, Senior Editor.
File History of U.S. Pat. No. 4,931,854 to Yonemasu et al.
Robert Keeler, "Multichip Module Shaves Lines to 10 Microns," *EP & P News in Electronics Manufacturing*, (undated).

Primary Examiner—Eugene R. LaRoche
Assistant Examiner—Reginald A. Ratliff
Attorney, Agent, or Firm—Merchant, Gould, Smith, Edell, Welter & Schmidt

[57] ABSTRACT

An integrated circuit chip carrier having reduced and predicable interlead capacitance, reduced glass chip formation, and improved wirebonding characteristics is disclosed. The chip carrier includes a substrate having a central cavity for locating an integrated circuit die, an inner channel and an outer channel, adhesive glass located in the channels and overflowing above the substrate surface, a leadframe mounted on the substrate having a plurality of leads embedded in the adhesive glass overflow and coplanarly resting on the substrate, the leads extending from beyond the substrate periphery inward to near the cavity rim, and a thin layer of sealing glass extending from the periphery of the substrate over the outer channel for hermetically sealing the chip carrier.

22 Claims, 6 Drawing Sheets

CHIP CARRIER

This is a continuation of application Ser. No. 447,641, filed Dec. 8, 1989, now abandoned.

FIELD OF THE INVENTION

The present invention relates to packages for semiconductor integrated circuits, and in particular to a chip carrier with a reduced and more predictable interlead capacitance, improved wirebonding characteristics, and reduced glass chip formation.

BACKGROUND OF THE INVENTION

Integrated circuits are typically packaged in hermetically sealed containers to prevent contamination which could disrupt the operation of their integrated circuit dies. These containers are known in the industry as "chip carriers."

Chip carriers are typically constructed from several component parts. The largest part is usually a plastic or ceramic base known as a "substrate." Additionally, the assignee of the present invention contemplates the use of silicon as a substrate material for the present invention. The substrate will usually have a cavity formed at its center to hold the integrated circuit die of the completed integrated circuit.

To transmit signal and power to and from the die conductive leads extending from beyond the outer periphery of the substrate to the interior of the chip carrier near the cavity are mounted on the substrate. The portion of the conductive leads extending beyond the substrate will be used to connect the integrated circuit to external circuitry. The end of the conductive leads near the cavity will have bonding wires attached to them that connect to bonding pads on the integrated circuit die. Thus, the conductive leads and bonding wires allow access to the die in the finished integrated circuit. Conductive leads are usually manufactured as a single part known in the industry as a "leadframe." A leadframe allows all of leads to be handled as a single component during assembly of the chip carrier.

Assembling of a typical chip carrier begins with the deposition of an adhesive glass layer on the surface of the substrate. The leadframe is then placed on the adhesive glass into which it becomes partially imbedded and thus attached to the substrate. Finally, a layer of sealing glass is deposited, from the outer periphery of the substrate inward, over the leadframe wires. The sealing glass will provide the hermetic seal required in the completed integrated circuit device.

The typical chip carrier is now assembled and ready to be used in the packaging of an integrated circuit. First, an integrated circuit die is attached in the cavity to the substrate. Next, the integrated circuit die is electrically connected by conductive wires, known in the industry as "bondwires," to the leadframe leads. The bondwires are typically attached ultrasonically or by thermocompression, one end to a pad on the integrated circuit die; the other to a part of the leadframe lead near the cavity. Next, a lid is placed over the chip carrier sealing glass. Finally, the package is heated sufficiently to melt the chip carrier sealing glass, but not the adhesive glass which has a higher melting point than the sealing glass. The melted sealing glass cools and forms a hermetic seal on the now packaged integrated circuit device.

While the above packaging scheme has been highly successful, the need by industry for increasingly fast and complex integrated circuits runs up against limitations in the above packaging scheme. To meet the requirements of faster and more complex integrated circuits, both the component density and need for communication points with the integrated circuit have increased. An example of a need for faster and more complex integrated circuits are modern super-computers, such as those manufactured by Cray Research, Inc., the assignee of the present invention.

More communication points require both more chip carrier leads and more pads on the integrated circuit die. Faster integrated circuits generally require that integrated circuit elements; transistors, resistors, etc, be as small as possible and that the distances between elements be minimized, resulting in an integrated circuit die with a small surface area. Since it is required in high speed circuits to minimize distances, the leads of a lead frame converge toward the die. The result is that more leads are located in a small area causing a decrease in spacing between the leads.

Unfortunately, a decreased spacing between the leads increases the capacitance between the leads. This interlead capacitance adversely affects the quality of signals transmitted on the leads of the leadframe by increasing: signal rise times and fall times; increasing signal reflections; causing greater impedance mismatches; increasing signal termination problems; creating a decrease in signal propagation velocity, and a coupling of signals between adjacent leads.

At very high speeds the proper termination of all transmission lines becomes important. Proper termination of an integrated circuit requires that the interlead capacitance be both accurately known and stable so that an effective termination can be designed and implemented. The above mentioned packaging scheme does not give the accurate and stable interlead capacitance required because the interlead dielectric constant depends on uncontrolled variables such as the length of the lead over the adhesive glass, the extent that the lead imbeds in the adhesive glass, the length of the lead under the sealing glass, and the extent that the sealing glass melts and flows between adjacent leads.

Typical prior art chip carrier specifications include allowable amounts of glass overflow and pullback. Glass overflow refers to glass flow down the edge of the substrate or wicking along the leads while glass pullback refers to concavities formed in the glass between the lead and the substrate or between the lead and the lid. Tight tolerances of glass overflow and pullback are difficult to meet using the prior art because of the thickness of the glass layers used.

Glass overflow is a problem because it causes glass chips when the overflow breaks off. Glass chips cause problems during plating of the leads, testing of the devices, and during assembly of the completed integrated circuit onto a circuit board. Additionally, if glass chips are formed at the inner cavity of the chip carrier the glass may be retained in the cavity and cause problems when attaching bondwires to the integrated circuit die or when attaching the die to the substrate. Glass pullback causes problems when plating the leads by inducing the plating to produce lead-to-lead shorts.

A major concern when interconnecting an integrated circuit die with the chip carrier leads is the quality of the wirebond at the leads. To obtain consistent bond quality all leads must be completely supported and highly coplanar since the bondwire tool places a compression force on the lead and is set to operate in a fixed plane. If a lead is much lower than its neighbors the resulting bond will be weak and pull-of. If the lead is much higher the bonding wire will be squashed into the lead and cause a break at the toe of the bond. If the lead is not completely supported when the wirebond tool comes down to attach the bonding wire the lead will flex and create a poor wirebond.

There is therefore a need for an integrated circuit chip carrier with closely spaced leadframe leads that permits interlead capacitance to be low, stable and accurately known; reduces the amount of glass chips caused by handling; and assists the formation of consistent quality wirebonds at the leads.

SUMMARY OF THE INVENTION

To solve the problems with the prior art described above and to solve other problems that will be readily apparent to those skilled in the art, the present invention describes a chip carrier with reduced lead lengths in contact with the adhesive glass used to retain the leads to the chip carrier substrate, channels in the chip carrier substrate for accurately controlling the length of the leads in contact with the adhesive glass, reduced lead lengths in contact with the sealing glass used to bond the lid on the chip carrier, a reduced sealing glass width, a reduction in sealing glass thickness, and a lead that rests on the substrate near the point of wirebonding.

The present invention results in a chip carrier with a smaller and more accurately known interlead capacitances than that of the prior art, reduces the amount of glass chips caused by handling the chip carrier, and assists the formation of consistent quality wirebonds.

DETAILED DESCRIPTION OF THE DRAWINGS

In the drawings, like numerals refer to the same item throughout the several views.

DETAILED DESCRIPTION OF THE PREFERRED EMBODIMENT

In the following detailed description of the preferred embodiments, references made to the accompanying drawings which form a part hereof, and in which is shown by way of illustration specific embodiments in which the present invention may be practiced. These preferred embodiments are described in sufficient detail to enable those skilled in the art to practice the invention, and it is to be understood that other embodiments may be utilized, and that structural or electrical changes may be made without departing from the spirit and scope of the present invention. The following detailed description is therefore, not to be taken in a limiting sense, and the scope of the present invention is defined by appended claims.

Figure 1:
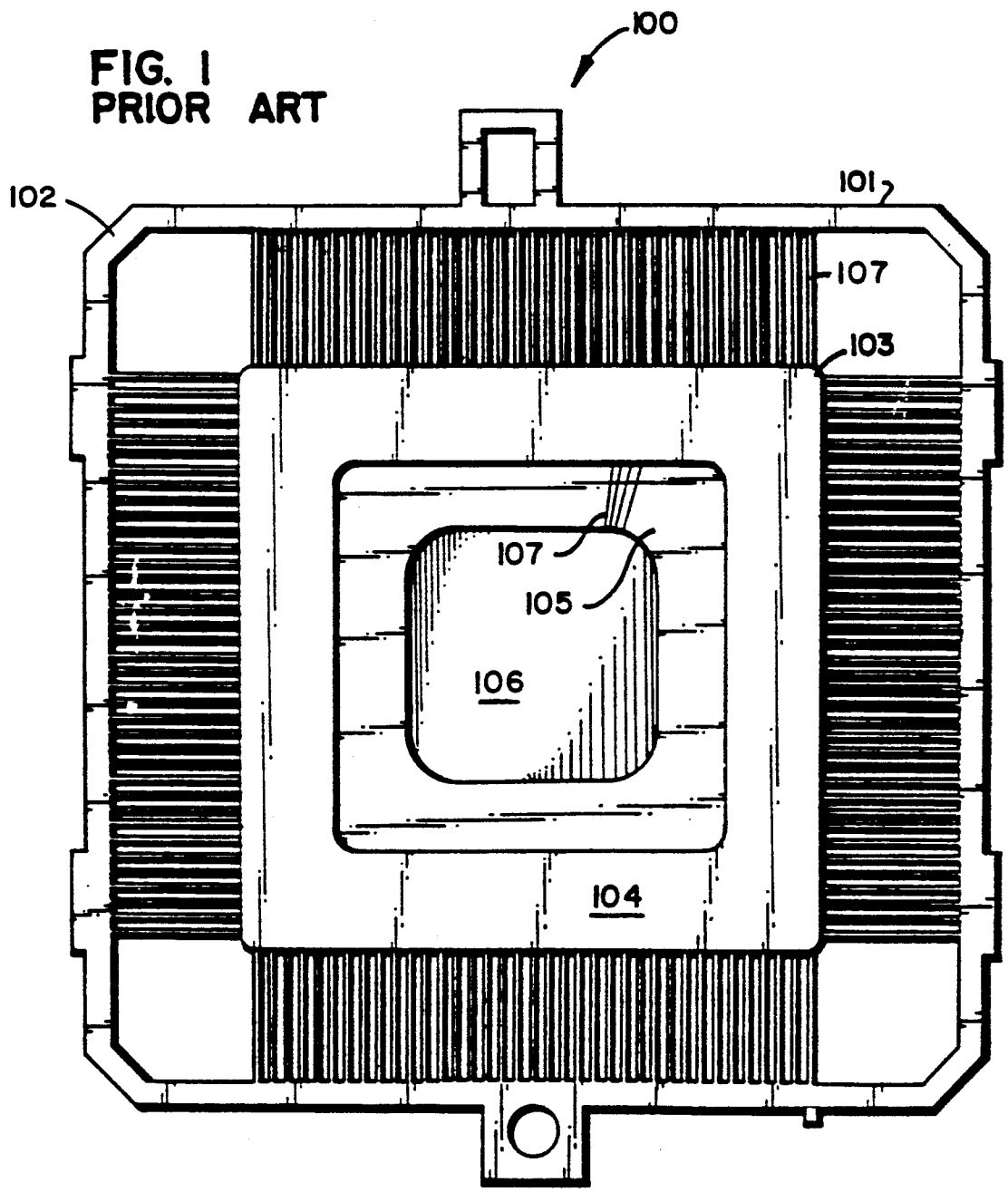
FIG. 1 is a top down view of an integrated circuit chip carrier according to the prior art.
Figure 2:
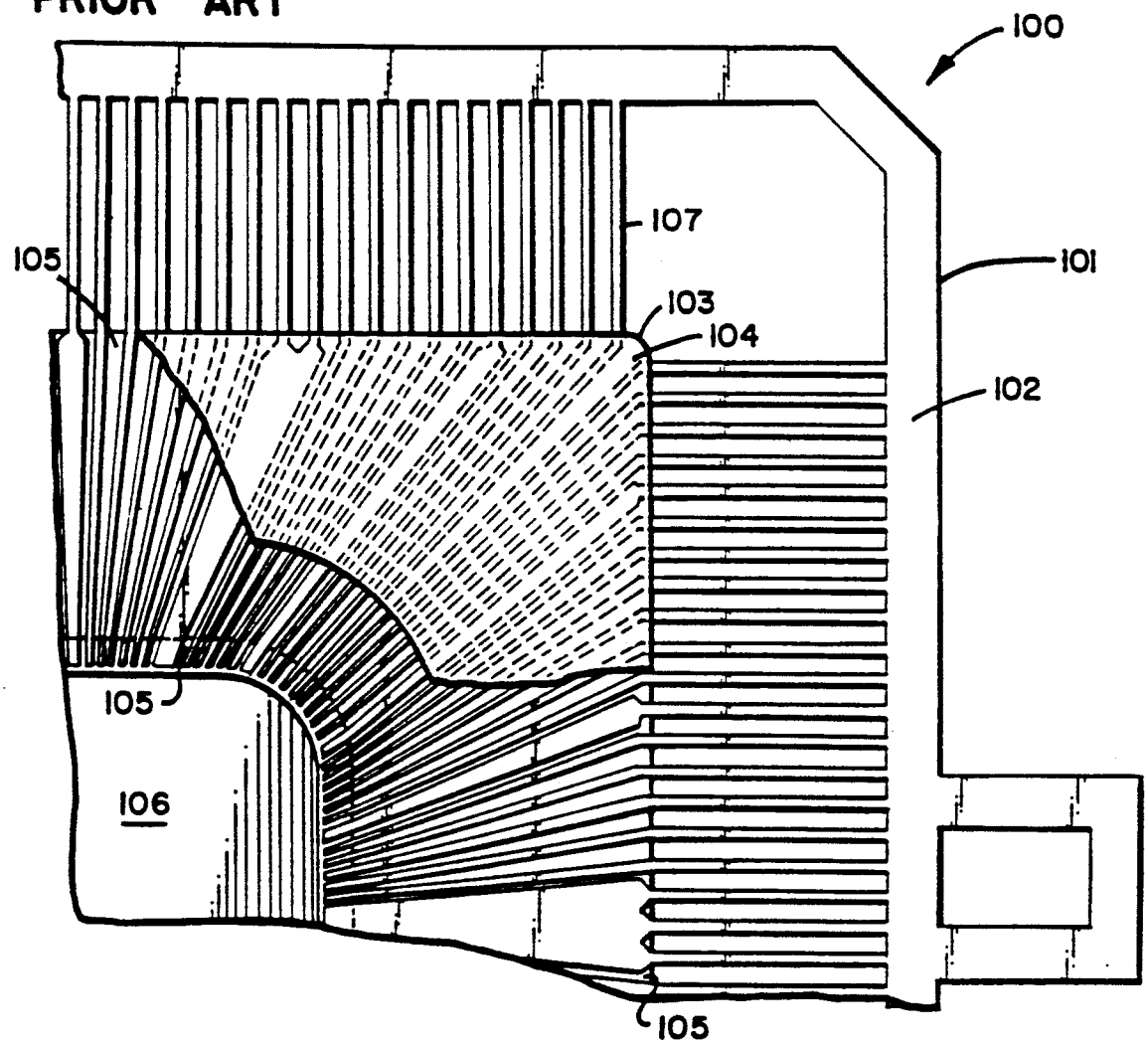
FIG. 2 is a close-up and detailed cut away view of a portion of a chip carrier according to the prior art.
Figure 3:
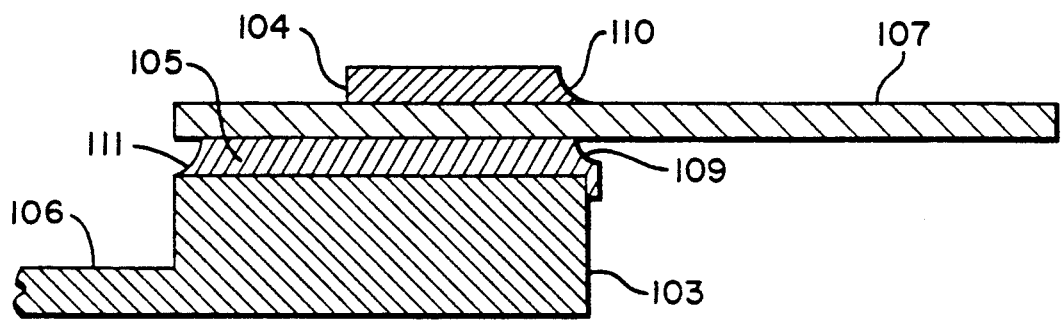
FIG. 3 is a cut-away side view of a chip carrier according to the prior art.

FIGS. 1-4 show a prior art integrated circuit chip carrier 100 before the outer edge 102 of the leadframe 101 is trimmed from the leads 107. Substrate 103 is typically constructed of ceramic, however, other materials such as plastic are often used and silicon is being investigated as a suitable material. Cavity 106 is located at the center of substrate 103 so that an integrated circuit die (not shown) may be placed and bonded therein. As shown in FIGS. 2 and 3, leads 107 are located with one end in close proximity to the rim of cavity 106. The other end of leads 107 are brought out past the periphery of substrate 103. Leads 107 connect to outer edge 102 of leadframe 101.

Figure 4:
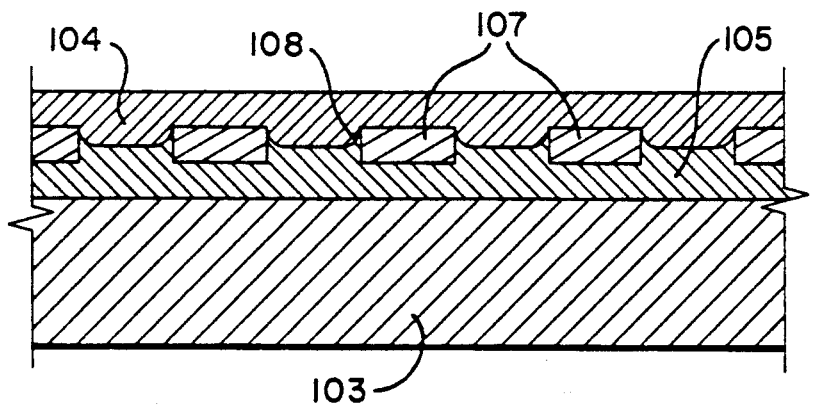
FIG. 4 is a detailed view axial with the leads showing the relative arrangement of the substrate, the leads and the glasses in the prior art.

During assembly of the chip carrier a layer of adhesive glass 105 is deposited on substrate 103. A typical layer of adhesive glass would be an eight (8) mil thickness of a glass such as Dow Corning 7583. Next, leads 107 of leadframe 101 are placed over adhesive glass 105. Leads 107 are typically about five (5) mils thick float on adhesive glass 105, which will wick up on the sides 108 of leads 107, as shown in FIG. 4. In lieu of adhesive glass, other bonding methods, materials or adhesives may be used.

Extending from the periphery of substrate 103 toward the cavity a layer of sealing glass 104 is deposited over leads 107. A typical layer of sealing glass will be about a twelve (12) mil thick layer of a glass such as Kyocera KC400. Sealing glass 104 is used to bond the lid (not shown) to chip carrier 100 during final assembly of the integrated circuit. Actual bonding is typically performed in an oven which raises the temperature to a point which causes sealing glass 104 to melt, creating a hermetic seal between the lid and the chip carrier 100. The melting point of adhesive glass 105 is higher than that of sealing glass 104 so that leads 107 are not disturbed during the sealing process.

The interlead capacitance of the finished integrated circuit is directly a function of the chip carrier. Chip carrier variables affecting interlead capacitance include the spacing between the leads, the effective lead area, and the material between the leads. The prior art interlead chip carrier material is an aggregation and combination of adhesive glass 105, sealing glass 104, and air. The interlead material is the dielectric for the interlead capacitance. Since an air dielectric results in the lowest capacitance, the presence of the glass compounds results in a greater capacitance for a given lead arrangement then that which would result if air was the only dielectric. Additionally, since sealing glass 104 is applied in a variable thickness and has an uncontrolled liquid flow when melted, and as the depth leads 107 imbed into adhesive glass 105 is uncontrolled, the interlead capacitance varies widely.

For the integrated circuit chip carrier 100 shown in FIGS. 1-4, a lead 107 traverses a distance of approximately two hundred (200) mils under sealing glass 104 and approximately three hundred (300) mils over adhesive glass 105. The interlead spacing typically tapers from about a six (6) mill spacing at the cavity 106 to twenty one (21) mils at the substrate periphery. While the above mentioned lead spacing and orientation variables, plus the highly variable dielectric constant between adjacent leads, preclude accurate generalizations of interlead capacitances in the prior art chip carrier of FIGS. 1-4, a typically value is about three (3) picofarads. This interlead capacitance results in crosstalk, reflections and combinations of crosstalk and reflections at high switching speeds.

Refer in the following discussion specifically to FIG. 3. The approximately twenty (20) mils combined thickness of the adhesive glass 105 and the sealing glass 104 aggravates glass chip formation. When a lead 107 is placed on the adhesive glass it partially embeds as described earlier. The adhesive glass 105 may spread out over the substrate to form a glass lip 109. Similarly, sealing glass 104 may spread over the lead to form a glass point 110. Movement of the lead may cause the glass lip 109 and/or the glass point 110 to break off, resulting in a glass chip. It is also possible for a concavity to be formed in either glass instead of a glass point or a glass lip. When a lead 107 is plated, the plating material may pack into the concavity and form a lead-to-lead short between leads 107.

Still referring specifically to FIG. 3. Obtaining a quality wirebond at leads 107 can be difficult. This is partially because, as stated previously, the degree that a lead 107 embeds in adhesive glass 105 is uncontrolled. Additionally, the actual thickness of adhesive glass 105 may vary over the periphery of the cavity 106. Therefore, leads 107 of the leadframe 101 may not be as highly coplanar as required to obtain a quality wirebond. Also, if a lead 107 is not completely supported at the point of the wirebond, such as at concavity 111 caused by a pull-back of adhesive glass 105, the lead may act as a spring-board under the wirebonding tool. The non-coplanarity and the spring-board effect act to reduce the consistent quality of the wirebond obtained.

Figure 5:
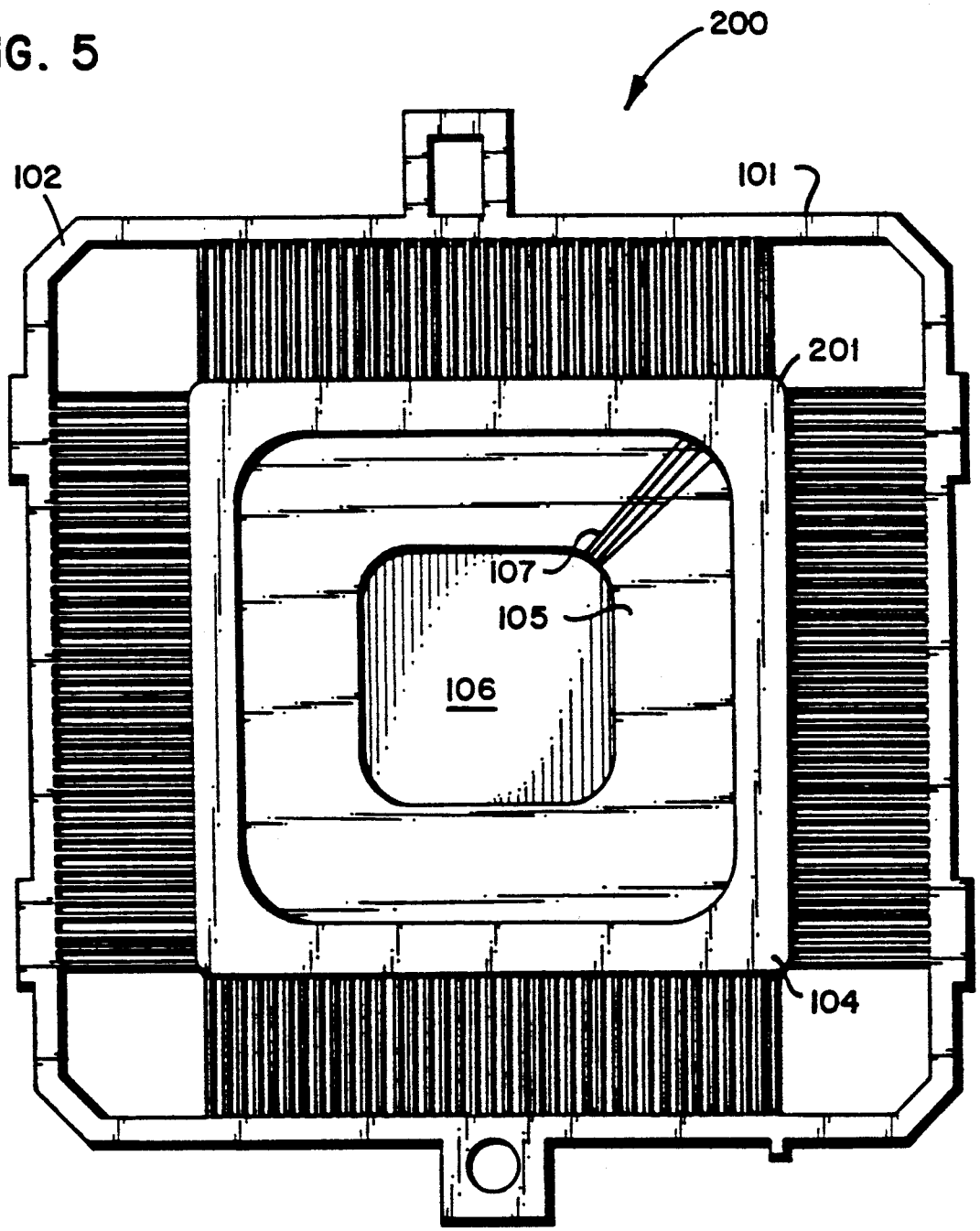
FIG. 5 is a top down view of an integrated circuit chip carrier according to the preferred embodiment of the present invention.
Figure 6:
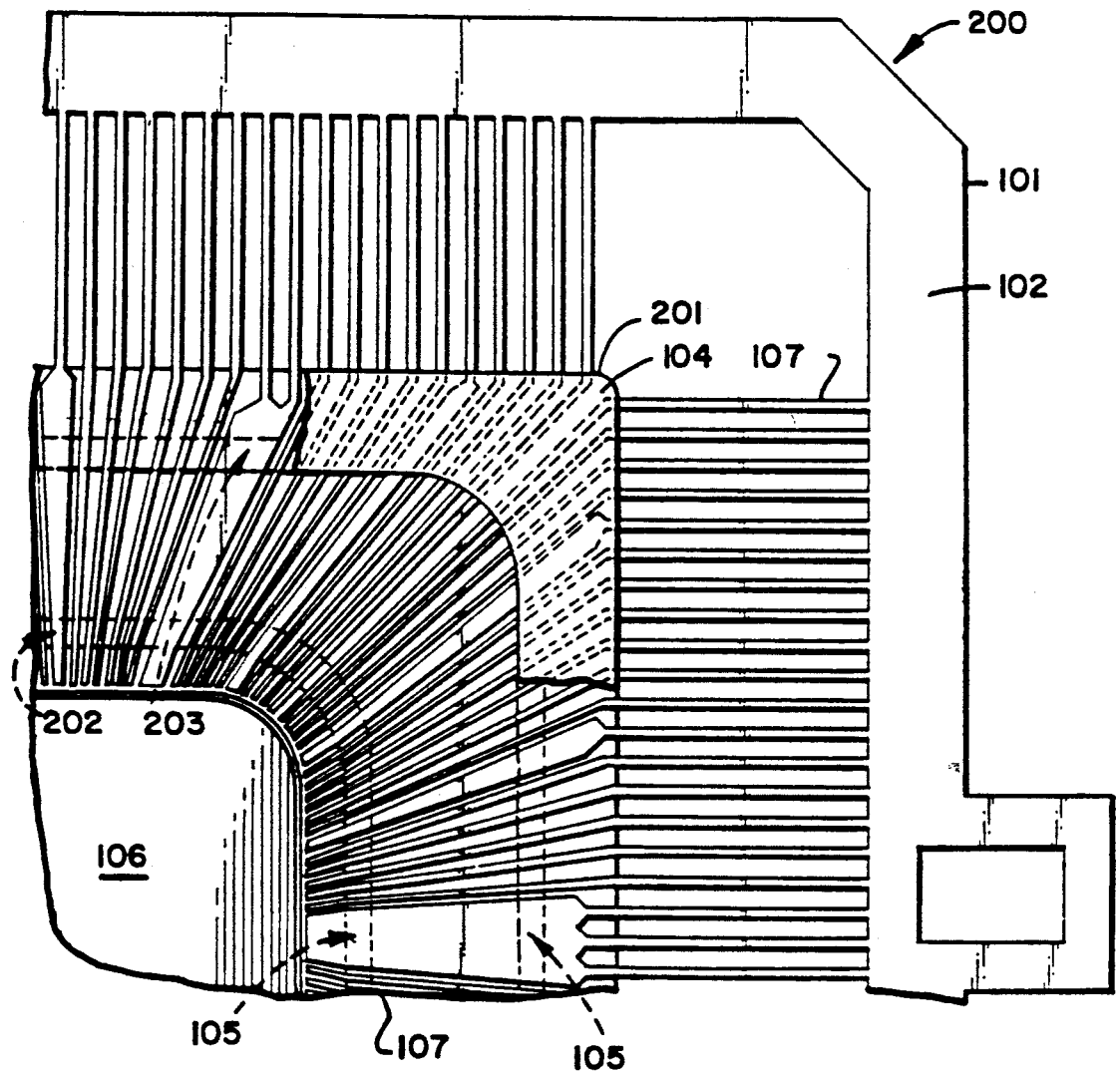
FIG. 6 is an unscaled close-up and detailed cut-away view of a portion of a chip carrier according to the preferred embodiment of the present invention.
Figure 7:
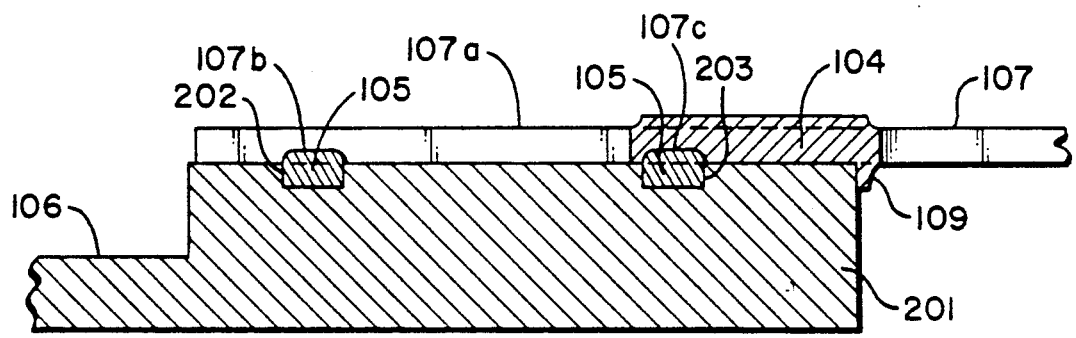
FIG. 7 is a detailed cut-away side view of a chip carrier according to the preferred embodiment of the present invention.

The preferred embodiment of the present invention is illustrated in FIGS. 5-7. FIG. 5 shows a top down view of an integrated circuit chip carrier 200. The same leadframe 101 having the same leads 107 and outer edge 102 is used as in the prior art. Additionally, the inner cavity 106 remains the same but now is formed on a substrate 201. Finally, sealing glass 104 and adhesive glass 105 are the same as in the prior art discussed above; however they are applied differently as described below.

Refer in the following discussion specifically to FIGS. 6 and 7 which show detailed close-up views of the preferred embodiment of the present invention. Leads 107 are located on the surface of substrate 201 and cross over inner channel 202 and outer channel 203. Leads 107 are attached to substrate 201 by adhesive glass 105 located in inner channel 202 and outer channel 203. Sealing glass 104 is placed over leads 107 extending from the periphery of substrate 201 inward past outer channel 203.

As shown in FIGS. 6 and 7, substrate 201 has an inner channel 202 and an outer channel 203. These channels, like cavity 106, may be constructed using a number of prior art techniques. The technique found most useful is to stamp channels 202 and 203 and cavity 106 into a ceramic substrate 201 while substrate 201 is in its uncured or "green" state. The stamping process can control the dimensions of the resulting channels and cavity to within one percent (1%) of the desired dimensions. After curing substrate 201 the stamped shapes do not change dimensions. Alternate methods for creating the channels and cavity include well known methods such as milling or chemical etching the substrate. The use of silicon as a substrate material is highly desirable because the channels and cavities of the present invention could be created by well known etching techniques.

In a finished integrated circuit the interlead capacitance at portion 107a, shown in FIG. 7, is a function of only an air dielectric since no glass has been deposited there. At 107b the dielectric is a function of both adhesive glass 105 and air since only adhesive glass 105 has been deposited at that point and, as discussed subsequently, the layer of adhesive glass 105 is thinner than lead 107. Finally, at 107c the dielectric becomes a combination of adhesive glass 105 and sealing glass 104 since both adhesive glass 105 and sealing glass 104 have been deposited there and the sealing glass has been melted to flow around the leads to create a hermetic seal. In all three regions the dielectric material is known and, as discussed below, controlled as to the thickness of composition. This permits the interlead capacitance to be low since air becomes the major dielectric, predicable, and repeatable.

In the present invention adhesive glass 105 is confined to both inner channel 202 and outer channel 203. Adhesive glass fills these channels to a height slightly above the surrounding substrate. When a leadframe 101 having leads 107 is placed over the substrate, leads 107 embeds in the adhesive glass overflow. Adhesive glass 105 than holds leadframe 101 in place. In the present invention length of a lead 107 in contact with adhesive glass 105 is less than in the prior art and is controlled by the width of channels 202 and 203. Therefore the dielectric effect of adhesive glass 105 in the present invention is both less then that of the prior art and better known. In the preferred embodiment of the present invention inner channel 202 is approximately forty (40) mils wide and outer channel 203 is approximately seventy five (75) mils wide. However, the present invention clearly and specifically anticipates other widths.

In the present invention the depth of channels 202 and 203 depend on the best dimensional control thickness of adhesive glass 105. In the preferred embodiment the adhesive glass layer can accurately be applied at a five (5) mil thickness. An overflow of 1½ mils of adhesive glass has been found effective to retain the leads 107 on substrate 201. Therefore a channel depth of 3½ mils allows for a 1½ mil overflow when a five (5) mil thickness of adhesive glass is applied in channels 202 and 203.

Confining adhesive glass 105 to channels 202 and 203 reduces lead 107 floating on adhesive glass 105. By accurately controlling the overflow of adhesive glass 105, as discussed above, leads 107 can embed in adhesive glass 105 sufficiently to rest directly on substrate 201 and eliminate the float. This is done in the preferred embodiment of the present invention. This implies that the coplanarity of leads 107 of leadframe 101 at the wirebonding point is controlled by the coplanarity of substrate 201. The coplanarity of substrate 201 is easily and accurately controlled by numerous methods well known in the art, such as planing. Additionally, since leads 107 directly contact substrate 201, the springboard effect is eliminated. Therefore the present invention assists the formation of quality wirebonds by eliminating several causes of poor quality wirebonds.

By controlling adhesive glass overflow in amount and location the wicking and spreading of adhesive glass 105 found in the prior art is reduced. This reduces or eliminates glass lips 109 caused by glass overflow in the prior art and thus reduces glass chip formation. Additionally, since adhesive glass is confined to the channels, the flow of adhesive glass into cavity 106 which can cause numerous problems is eliminated.

As shown in FIG. 7 sealing glass 104 is placed from the periphery of substrate 201 over leads 107. While this was also done in the prior art, the width of the sealing glass layer in the present invention is reduced and tightly dimensionally controlled. In the preferred embodiment of the present invention sealing glass 104 is deposited with a width of 100 mils, verses the approximately 200 mils in the prior art. This width has been shown sufficient to hermetically seal the lid (not shown) to substrate 201. Present indications are that the width may be reducible to 75 mils. By reducing and controlling the width of the sealing glass layer its dielectric effect is both less than and better known then in the prior art.

In the present invention the thickness of the sealing glass 104 layer is reduced from the approximately 12 mils of the prior art to approximately 7½ mils thickness. The thickness must be sufficient to cover the leads 107, in the preferred embodiment about five (5) mils, plus a sufficient additional thickness to planarize the surface and create a hermetic seal. An additional thickness of two (2) to three (3) mils has been shown to be sufficient.

The thinner layer of sealing glass 104 in the present invention reduces the amount of glass available to form the glass lip 110 produced by glass overflow as described in the prior art. With glass lip 110 reduced or eliminated the production of glass chips is also reduced or eliminated. Additionally, the thin film of sealing glass 104 reduces glass pullback and therefore reduces the possibility of lead-to-lead shorts when plating the leads 107.

The present invention results in a shorter length of lead 107 in contact with adhesive glass 105 and with sealing glass 104. The reduced length of lead 107 in contact with the glasses results in a greater dielectric length of air, which reduces the interlead capacitance. Additionally, since both the contact lengths of the glasses with the leads and the composition of the dielectric material between leads are controlled, the interlead capacitance is better known. Also, by reducing the thickness of the glass layers used, by controlling the locations of the glasses, and by resting leads 107 directly on substrate 201, the formation of glass chips is reduced or eliminated and causes of poor quality wirebonds are eliminated.

Figure 8:
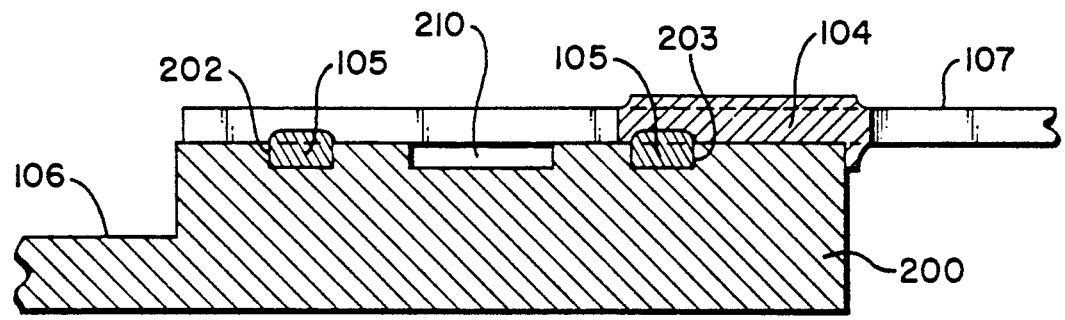
FIG. 8 shows a cut-away side view of an alternate embodiment of the present invention. A third channel is cut in the substrate underneath the leads to reduce the capacitive effect between the leads and the substrate.

FIG. 8 shows an alternate embodiment of the present invention having a third channel 210 located on substrate 201. The addition of the third channel reduces the capacitance between leads 107 and substrate 201 by increasing the distance between substrate 201 and leads 107. Channel 210 can be formed in a manner similar to that of inner channel 202 and outer channel 203. The width of channel 210 is immaterial provided that it does not interfere with channels 202 and 203. The capacitance reduction caused by channel 210 is enhanced by making the channel as deep and as wide as possible.

While the present invention has been described in connection with the preferred embodiment thereof, it is to be understood that many modifications will be readily apparent to those of ordinary skill in the art and this application is intended to cover any adaptations or variations thereof. Therefore, it is manifestly intended that this invention be limited only by the claims and the equivalences thereof.

We claim:

1. A chip carrier, comprising:
   a substrate having a top surface with a cavity and a first channel surrounding said cavity;
   a plurality of conductive leads adjacent said substrate top surface, said conductive leads extending from the periphery of said substrate over said first channel; and
   adhesive means substantially confined to said first channel, said adhesive means of a sufficient thickness to contact said conductive leads so that said adhesive means attaches said plurality of conductive leads to said substrate and the amount of said adhesive means in contact with said conductive leads is controlled.

2. The chip carrier according to claim 1 further including a sealing means contacting said conductive leads at the periphery of said substrate.

3. The chip carrier according to claim 2, wherein said conductive leads contact said substrate.

4. The chip carrier according to claim 3, wherein said substrate top surface further includes:
   a second channel surrounding said first channel, and said adhesive means located in said second channel and contacting said conductive leads further attaching said plurality of conductive leads to said substrate.

5. The chip carrier according to claim 4, wherein said sealing means extends inward from the periphery of said substrate to said second channel.

6. The chip carrier according to claim 5 wherein said substrate top surface adjacent to said cavity is substantially planar.

7. The chip carrier according to claim 6, wherein said sealing means ia a layer of glass less than 10 mils thicker than the height of said conductive leads.

8. The chip carrier according to claim 7, wherein said sealing means is less than 150 mills wide.

9. The chip carrier according to claim 8, wherein said substrate is a ceramic compound.

10. The chip carrier according to claim 7, further including a third channel between said second channel and said first channel, said third channel for reducing capacitive coupling between said substrate and said conductive leads.

11. A chip carrier according to claim 7, wherein said substrate material is silicon.

12. A chip carrier package, comprising:
    a substrate having a planar surface, with:
    (a) a cavity depressed from said planar surface for receiving an integrated circuit chip;
    (b) an inner channel depressed from said planar surface, said inner channel concentric to said cavity such that a first surface area is defined on said planar surface between said cavity and said inner channel;
    (c) an outer channel depressed from said planar surface, said outer channel concentric to said inner channel such that a second surface area is defined on said planar surface between said inner channel and said outer channel and such that a third surface area is defined on said planar surface between said outer channel and the periphery of said substrate;
    (d) a leadframe having a plurality of conductive leads adjacent to said planar surface; and (e) adhesive means substantially confined to one of said inner channel and said outer channel, such that said adhesive means attaches said conductive leads to said substrate and the amount of said adhesive means in contact with said conductive leads is controlled.

13. The chip carrier according to claim 12, further including adhesive means substantially confined to both said inner channel and said outer channel and contacting said conductive leads, said adhesive means for attaching said conductive leads to said planar surface.

14. The chip carrier according to claim 13, wherein said conductive leads are contiguous with said planar surface.

15. The chip carrier according to claim 14, further including sealing means connected to said plurality of leads at said third surface area, said sealing means for subsequent attachment of a lid.

16. The chip carrier according to claim 15 wherein said adhesive means and said sealing means are glass compounds.

17. The chip carrier according to claim 16 wherein said sealing means is less than 10 mils thicker then said conductive leads.

18. The chip carrier according to claim 17 wherein said sealing means extends inward from the periphery of said substrate to said outer channel.

19. The chip carrier according to claim 15 further including a middle channel between said inner channel and said outer channel, said middle channel for reducing capacitance between said conductive leads and said substrate.

20. A chip carrier, comprising:
    a substrate having a top surface with a cavity and a channel adjacent said cavity;
    a leadframe having a plurality of conductive leads adjacent said substrate top surface, said leadframe positioned such that at least a portion of said plurality of said conductive leads bridge said channel; and
    adhesive means substantially confined to said channel, said adhesive means of a sufficient thickness to contact said portion of said plurality of conductive leads so that said adhesive means attaches said portion of said plurality of conductive leads to said substrate and the amount of said adhesive means in contact with said portion of said plurality of conductive leads is controlled.

21. The package of claim 1, wherein said substrate consists of ceramic and said adhesive consists of glass.

22. A ceramic substrate for a reduced-capacitance chip carrier, comprising:
    a substantially planar surface,
    a cavity for containing an integrated circuit chip on said surface,
    a first channel located on said surface,
    a lead frame having a plurality of leads,
    adhesive means substantially confined to said first channel for attaching said leads,
    said substrate being manufactured by a process comprising the steps of:
    (a) providing an uncured ceramic substrate material having a substantially planar surface;
    (b) creating a cavity on said planar surface;
    (c) creating a first channel in said uncured ceramic substrate material on said planar surface, said first channel concentric to said cavity; and
    (d) curing said uncured ceramic substrate material with heat.

* * * * *